United States Patent
Arena et al.

[11] Patent Number: 6,121,140
[45] Date of Patent: Sep. 19, 2000

[54] METHOD OF IMPROVING SURFACE MORPHOLOGY AND REDUCING RESISTIVITY OF CHEMICAL VAPOR DEPOSITION-METAL FILMS

[75] Inventors: Chantal Arena, Mesa; Ronald T. Bertram, Phoenix, both of Ariz.; Emmanuel Guidotti, Barberaz, France; Joseph T. Hillman, Scottsdale, Ariz.

[73] Assignee: Tokyo Electron Limited, Tokyo, Japan

[21] Appl. No.: 08/948,955

[22] Filed: Oct. 9, 1997

[51] Int. Cl.[7] .................................................. H01L 21/44
[52] U.S. Cl. ........................... 438/687; 438/688; 438/677
[58] Field of Search .................................. 438/687, 688, 438/680, 681, 651, 677

[56] References Cited

U.S. PATENT DOCUMENTS

| | | | |
|---|---|---|---|
| 5,576,071 | 11/1996 | Sandhu | 427/534 |
| 5,628,829 | 5/1997 | Foster et al. | 118/723 E |
| 5,773,363 | 6/1998 | Derderian et al. | 438/672 |

FOREIGN PATENT DOCUMENTS 288754  11/1988  European Pat. Off. ................. 21/285

OTHER PUBLICATIONS

Norman et al., "Surface and Reactor Effects on Selective Copper Deposition From Cu(hfac)tmvs", Mat. Res. Soc. Symp. Proc. vol. 282, 1993 Materials Research Society 347–352.
Hochberg et al., "Chemical Additives for Improved Copper CVD Processing Using (HFAC) CU(TMVS)", Materials Research Society, Symposium Proceedings vol. V–10, Advanced Metallization for ULSI Applications in 1994, Roc Blumenthal and Guido Janssen, editors, 79–86.
Norman et al., "A new metal–orgainc chemical vapor deposition process for selective copper metallization", Materials Science and Engineering, B17 (1993) 87–92.
Gelatos et al., "Chemical Vapor Deposition of Copper for Advanced On–Chip Interconnects", MRS Bulletin, Aug. 1994 49–54.
Norman et al., "New OMCVD Precursors for Selective Copper Metallization", Journal de Physique IV, Colloque C2, suppl. au Journal de Physique II, vol. 1, Sep. 1991 C2–271—C2–278.
Parameter et al., "Characterization of thin copper films grown via chemical vapor deposition using liquid coinjection of trimethyvinylsilane and (hexafluoroacetylacetonate) Cu (trimethylvinylsilane)", J. Vac. Sci. Technol. B, vol. 13, No. 1, Jan./Feb. 1995 130–136.
Norman et al., "Chemical additives for improved copper chemical vapour deposition processing", Thin Solid Films 262 (1995) 46–51.
Norman et al., "New Precurcors for Blanket and Selective CVD Copper".
Gebo et al., "An Integrated CVD Copper and Collimated Tantalum Process".
Eisenbraun, Eric T, et al., Enhanced growth of device–quality copper by hydrogen plasma–assisted chemical vapor deposition, Appl. Phys. Lett. 60(25), Jun. 22, 1992, pp. 3126–3128.
Deposit and Etch Technique for Making Smooth, Low Resistivity Tungsten Films, Research Disclosure, No. 305, Sep. 1, 1989, p. 633.
Mikagi et al., "Barrier Metal Free Copper Damascene Interconnection Technology Using Atmospheric Copper Reflow and Nitrogen Doping in SiOF Film", IEDM 96–365–368 14.5.1–14.5.4.
Raj et al., "Selection of Copper Precursors for the Codeposition of Copper with Aluminum and/or Deposition of Copper"—A Brief Report.

Primary Examiner—C. Everhart
Attorney, Agent, or Firm—Wood, Herron & Evans, L.L.P.

[57] ABSTRACT

A method of producing a thick metal film on a substrate surface with a substantially smooth surface morphology and low resistivity. A substrate is exposed to a plasma. A first thin metal film is deposited on the substrate by chemical vapor deposition. The substrate with the film deposited thereon is exposed to a plasma, and a second thin metal film is deposited on top of the first film. The substrate may undergo subsequent cycles of plasma exposure and film deposition until a desired film thickness is obtained. The resulting film has a smooth surface morphology and low resistivity.

17 Claims, 1 Drawing Sheet

METHOD OF IMPROVING SURFACE MORPHOLOGY AND REDUCING RESISTIVITY OF CHEMICAL VAPOR DEPOSITION-METAL FILMS

FIELD OF THE INVENTION

This invention relates generally to chemical vapor deposition (CVD) of a metal film on a semiconductor substrate, and more specifically to a method of producing a substrate surface having a metal film coating that is relatively smooth and has low resistivity.

BACKGROUND OF THE INVENTION

In the formation of integrated circuits (IC), thin films containing metal and metalloid elements are often deposited upon the surface of a semiconductor substrate to provide conductive and ohmic contacts in the circuits and between the various devices of an IC. For example, a thin film of a desired metal might be applied to the exposed surface of a contact or via hole on a semiconductor substrate. The film, passing through the insulative layers on the substrate, provides plugs of conductive material for the purpose of making interconnections across the insulating layers.

One well known process for depositing a thin metal film is chemical vapor deposition (CVD). In CVD, a thin film is deposited using chemical reactions between various deposition or reactant gases at the surface of the substrate. Reactant gases are pumped into proximity to a substrate inside a reaction chamber, and the gases subsequently react at the substrate surface resulting in one or more reaction by-products which form a film on the exposed substrate surface.

A thin metal film deposited by chemical vapor deposition on a substrate has a smooth, mirror-like surface morphology. As more film is deposited, however, the surface morphology of the film becomes rough and hazy in direct proportion to the film thickness. A rough surface is undesirable because it results in electromigration, whereby metal atoms are transported along grain boundaries driven by the force exerted by flowing electrons under high current densities. As a result, voids form at one end and extrusions form at the other end of the metal lines. This leads to an increased probability of circuit failure in the area of the voids.

Where a copper film is deposited, in addition to a smooth surface morphology, it is desirable for commercial production of semiconductor substrates that the films have a resistivity that is close to a bulk resistivity of 1.68 $\mu$ohms-cm, which is the resistivity of pure copper metal. Copper films with a resistivity higher than about 2 $\mu$ohms-cm have less viability as a manufacturing technology since other metals with similar high resistivities can replace copper. Factors that may influence film resistivity include film thickness, density, purity, and grain size.

Accordingly, there is provided a method of producing substrates coated with thick metal films that have a smooth surface morphology and low resistance.

SUMMARY OF THE INVENTION

To this end, and in accordance with the principles of the present invention, one objective of the present invention is to provide a metal film on a substrate surface that has a substantially smooth surface morphology.

Another objective of the present invention is to provide a metal film on a substrate surface that has a low resistivity.

A further object of the present invention is to provide a copper film on a substrate surface that has a substantially smooth surface morphology and low resistivity.

A still further object of the present invention is to provide a substrate having a copper film coating greater than about 750 Å thick with a substantially smooth surface morphology and a resistivity of less than about 2 $\mu$ohm-cm.

Specifically, this invention is directed to a method of depositing, on a substrate surface, a metal film having a smooth surface morphology and low resistivity. More specifically, this invention is directed to a method of depositing, on a substrate surface, a copper film that has thickness of greater than about 750 Å with a smooth surface morphology and a resistivity comparable to copper films less than about 750 Å thick.

According to principles of the present invention, a method is provided in which a substrate is exposed to a plasma. A thin metal film is deposited on the substrate surface by chemical vapor deposition. The coated substrate is exposed to a plasma. A second thin metal film layer is subsequently deposited over the previously deposited film layer on the substrate surface. The substrate is again exposed to a plasma. Successive cycles of depositing additional film layers and exposing to a plasma are performed to yield films of a desired thickness. In a preferred embodiment, the plasma is a hydrogen/argon plasma and the film is a copper film. Copper films deposited using the method of this invention exhibit a resistivity close to the bulk resistivity of pure copper metal and have a substantially smooth surface morphology.

By virtue of the foregoing, there is thus provided a method for providing a substantially smooth surface morphology and low resistivity of thick metal films deposited on a substrate by chemical vapor deposition. These and other objects and advantages of the present invention shall be made apparent from the accompanying drawings and description thereof.

DETAILED DESCRIPTION OF THE DRAWINGS

Figure 1:
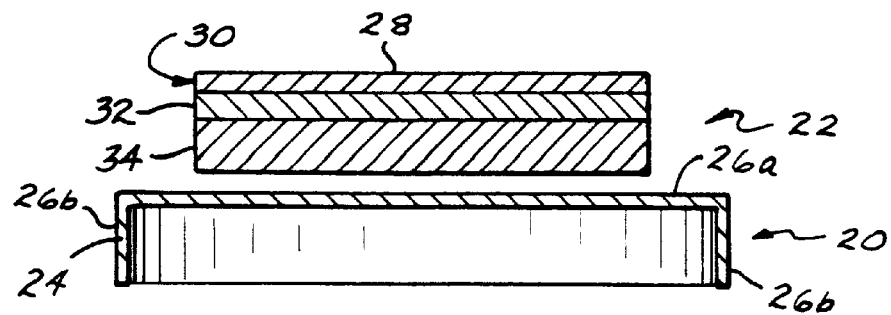
FIG. 1 is a schematic of a susceptor and a substrate.

With reference to FIG. 1, a susceptor 20 for a semiconductor substrate 22 during copper CVD is shown. A typical susceptor 20 has a native oxide layer 24 on its top 26a and side 26b surfaces. A substrate 22 is supported upon the susceptor 20 for processing. The substrate 22 has as its top surface 28 a native oxide layer 30 of about 10 Å to about 20 Å thick. This top layer 30 is, in turn, on top of a TiN layer 32 of about 500 Å thick which, in turn, is coated on a layer of silicon 34.

Figure 2:
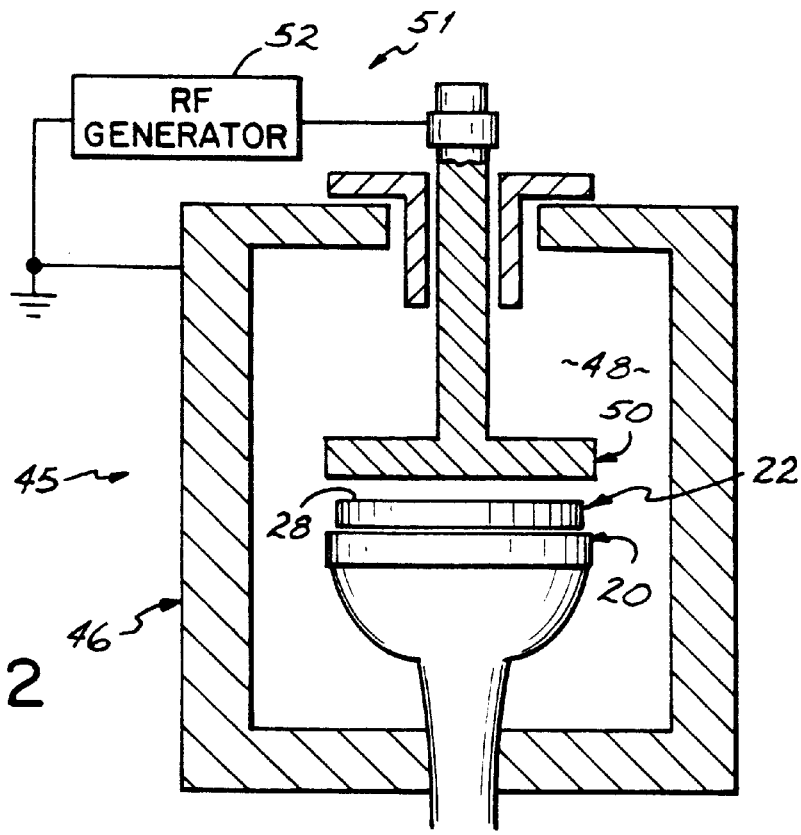
FIG. 2 is a schematic cross-sectional view of a reaction chamber for copper CVD.

With reference to FIG. 2, a reactor 45 for copper deposition on a surface 28 of a semiconductor substrate 22 by chemical vapor deposition is illustrated. The reactor 45 includes a reaction chamber 46 which encloses a processing space 48. In the reaction chamber 46, which is shown as containing a substrate 22 on a susceptor 20, reactant gases for CVD are delivered to a processing space 48. A gas delivery system such as the system described in U.S. Pat. No. 5,628,829 METHOD AND APPARATUS FOR LOW TEMPERATURE DEPOSITION OF CVD AND PECVD FILMS, which is assigned to the Assignee of the present invention and is hereby specifically incorporated in its entirety by reference, provides the proper flow and distribution of the gases for the CVD process. Generally, gas delivery systems contain gas-dispersing elements, such as a flat showerhead 50, in the reaction chamber 46. The showerhead 50 spreads the entering reactant gases around the processing space 48 of the reaction chamber 46 to ensure a uniform distribution and flow of the gases proximate the susceptor 20 and substrate 22. Uniform gas distribution and flow is desirable for a uniform and efficient deposition process, a dense plasma, and a uniformly deposited film.

For copper film deposition two molecules of the copper precursor, copper$^I$ hexafluoroacetylacetonate trimethylvinylsilane (Cu$^I$(hfac) (tmvs)), react to generate copper metal in the following disproportionation reaction:

2 Cu$^I$ (hfac) (tmvs) →Cu$^o$+Cu$^{II}$(hfac)$_2$+2 (tmvs) The tmvs ligand stabilizes the precursor during its vaporization stage, and the hfac ligand activates the precursor toward a higher metallization rate at the substrate surface. Typical conditions in the reaction chamber 46 are: substrate temperature of about 170° C., reaction pressure of about 0.5 torr to about 2.0 torr, precursor flow of about 0.2 ml/min to about 1.0 ml/min of liquid (equivalent to about 16–80 sccm of vapor), and diluent flow of about 100 sccm.

According to one embodiment of the present invention, the reactor 45 is equipped with a plasma producing apparatus 51 for exposing the susceptor 20 to a hydrogen/argon plasma prior or subsequent to the placing of the substrate 22 thereon for processing. The apparatus 51 to expose the susceptor 20 to the hydrogen/argon plasma may be the type described in copending U.S. patent application Ser. No. 08/797,397, now U.S. Pat. No. 5,906,866, PROCESS FOR CHEMICAL VAPOR DEPOSITION FOR TUNGSTEN ONTO A TITANIUM NITRIDE SUBSTRATE SURFACE, which is assigned to the Assignee of the present invention and is expressly incorporated herein by reference. The apparatus 51 preferably includes a radio frequency (RF) generator 52, capable of generating 450 KHz, which is attached to the showerhead 50.

In the method of the present invention, a substrate 22 supported on a susceptor 20 is exposed to a hydrogen/argon plasma in the reaction chamber 46. The conditions in the reaction chamber 46 are: chamber pressure of about 1 torr; power of about 750 W; frequency of about 450 KHz; hydrogen flow of about 200 sccm; argon flow of about 50 sccm, time of about 10 sec; and substrate temperature of about 170° C.

Copper$^1$(hfac)(tmvs) is deposited in a thin layer by chemical vapor deposition on the substrate 22 to form a thin copper film. In a preferred embodiment, the copper film is approximately 500 Å thick. The conditions in the reaction chamber 46 are as follows: substrate temperature of about 170° C.; chamber pressure of about 0.5–2.0 torr; precursor flow rate of about 0.2–1.0 ml/min; and diluent flow rate of about 100 sccm.

The substrate 22 is subsequently exposed to a hydrogen/argon plasma under the same conditions as previously described for plasma exposure. A second thin layer of copper is subsequently deposited on top of the first layer under the conditions in the reaction chamber 46 as previously described for copper deposition. Preferably, the second copper film layer is about 300 Å thick. Subsequent additional cycles of plasma exposure followed by copper deposition may be used to produce a copper film of a desired thickness.

While the present invention has been illustrated by description of embodiments, and while the illustrative embodiments have been described in considerable detail, it is not the intention of the inventor to restrict or in any way limit the scope of the appended claims to such detail. Additional advantages and modifications will readily appear to those skilled in the art. For example, the susceptor 20 may be pretreated with a metal film to eliminate an edge effect on the substrate 22, as described in the concurrently filed application entitled U.S. Ser. No. 09/009,387, pending "METHOD OF ELIMINATING EDGE EFFECT IN CHEMICAL VAPOR DEPOSITION OF A METAL," which is expressly herein incorporated by reference in its entirety. The invention in its broader aspects is therefore not limited to the specific details, representative apparatus and methods, and illustrative examples shown and described. Accordingly, departures may be made from such details without departing from the spirit or scope of applicant's general inventive concept.

Having described the invention, what is claimed is:

1. A method for depositing a copper film on a substrate surface by chemical vapor deposition, comprising the steps of (a) depositing a first copper film on at least one surface of the substrate, (b) exposing the substrate having a copper film deposited thereon to a hydrogen/argon plasma, and (c) depositing a second copper film having a smooth surface morphology and low resistivity on top of the first copper film on the surface of the substrate.

2. The method of claim 1, further comprising repeating steps (c) and (d) to achieve a desired film thickness.

3. A method for depositing a metal film on a substrate surface by chemical vapor deposition comprising the steps of (a) exposing a substrate to a hydrogen/argon plasma, (b) depositing a first copper film on at least one surface of the substrate, (c) exposing the substrate having the copper film deposited thereon to a hydrogen/argon plasma, and (d) depositing a second copper film on top of the first copper film on the surface of the substrate.

4. The method of claim 3, further comprising repeating steps (c) and (d) to achieve a desired film thickness.

5. The method of claim 3, the depositing steps occurring in a reaction chamber under a pressure in the range of about 0.1–10 torr, and preferably in the range of about 0.5 torr to 2.0 torr.

6. The method of claim 3, the depositing steps occurring in a reaction chamber at a precursor flow in the range of about 0.01 ml/min to about 5 ml/min, and preferably in the range of about 0.2 ml/min to about 1.0 ml/min.

7. The method of claim 3, the depositing steps occurring in a reaction chamber under a hydrogen flow in the range of about 10–1500 sccm, and preferably about 100 sccm.

8. The method of claim 3, the depositing steps occurring in a reaction chamber at a susceptor temperature in the range of about 120–280° C., and preferably about 170° C.

9. The method of claim 3, the exposing steps occurring in a reaction chamber under a pressure in the range of about 0.1–25 torr, and preferably about 1 torr.

10. The method of claim 3, the exposing steps occurring in a reaction chamber at a power in the range of about 50–1500 W, and preferably about 750 W.

11. The method of claim 3, the exposing steps occurring in a reaction chamber at a frequency in the range of about 250–500 KHz, and preferably about 450 KHz.

12. The method of claim 3, the exposing steps occurring in a reaction chamber under a hydrogen flow in the range of about 50–5000 sccm, and preferably about 200 sccm.

13. The method of claim 3, the exposing steps occurring in a reaction chamber under an argon flow in the range of about 10–1500 sccm, and preferably about 50 sccm.

14. The method of claim 3, the exposing steps occurring in a reaction chamber at a susceptor temperature in the range of about 120–280° C., and preferably about 170° C.

15. The method of claim 3, the exposing steps occurring in a reaction chamber for a time in the range of about 2–240 seconds, and preferably about 10 seconds.

16. A method for producing a CVD-copper film on a substrate, comprising the steps of:

(a) exposing a substrate supported on a susceptor to a hydrogen/argon plasma;

(b) depositing a first copper film of about 500 Å thick on at least one surface of the substrate;

(c) exposing the substrate containing the copper film to a hydrogen/argon plasma; and (d) depositing a second copper film of about 300 Å thick on top of the first copper film on the surface of the substrate.

17. The method of claim 16, further comprising:

repeating steps (c) through (d) to achieve a desired film thickness.

* * * * *

UNITED STATES PATENT AND TRADEMARK OFFICE
CERTIFICATE OF CORRECTION

PATENT NO. : 6,121,140
DATED : September 19, 2000
INVENTOR(S) : Chantal Arena et al.

It is certified that error appears in the above-identified patent and that said Letters Patent is hereby corrected as shown below:

Column 4,
Lines 27-28, "repeating steps (c) and (d)" should be -- repeating steps (b) and (c) --.

Signed and Sealed this

Twenty-eighth Day of August, 2001

*Attest:*

NICHOLAS P. GODICI
*Attesting Officer*    Acting Director of the United States Patent and Trademark Office